United States Patent [19]

Kato et al.

[11] Patent Number: 4,733,074

[45] Date of Patent: Mar. 22, 1988

[54] SAMPLE SURFACE STRUCTURE MEASURING METHOD

[75] Inventors: Makoto Kato, Kawasaki; Tetsuo Yokoyama, Nakano; Jyuntaro Arima, Katsuta; Shimbu Yamagata, Yokohama; Mikihiko Oi, Kokubunji; Toshihiro Furuya, Katsuta, all of Japan

[73] Assignee: Hitachi, Ltd., Tokyo, Japan

[21] Appl. No.: 852,741

[22] Filed: Apr. 16, 1986

[30] Foreign Application Priority Data

Apr. 17, 1985 [JP] Japan ................................ 60-80129
Apr. 17, 1985 [JP] Japan ................................ 60-80130

[51] Int. Cl.$^4$ .............................................. H01J 37/00
[52] U.S. Cl. .................................... 250/307; 250/310; 250/492.2
[58] Field of Search ............... 250/306, 307, 310, 311, 250/492.2, 396 R, 398, 399, 492.3

[56] References Cited

U.S. PATENT DOCUMENTS

| | | | |
|---|---|---|---|
| 3,329,813 | 7/1967 | Hashimoto | 250/310 |
| 3,597,607 | 8/1971 | Campbell et al. | 250/310 |
| 3,876,879 | 4/1975 | McAdams et al. | 250/310 |
| 4,221,965 | 9/1980 | Konishi et al. | 250/310 |
| 4,556,797 | 12/1985 | Kuni et al. | 250/492.2 |

FOREIGN PATENT DOCUMENTS

| | | | |
|---|---|---|---|
| 0054160 | 3/1984 | Japan | 250/310 |
| 0000741 | 1/1985 | Japan | 250/492.2 |
| 8504250 | 9/1985 | PCT Int'l Appl. | 250/310 |

*Primary Examiner*—Bruce C. Anderson
*Assistant Examiner*—Paul A. Guss
*Attorney, Agent, or Firm*—Antonelli, Terry & Wands

[57] ABSTRACT

A sample surface structure measuring method using a scanning type electron microscope featured by scanning the sample surface by an electron beam incident from above the sample surface; measuring the amount of the secondary electrons discharged according to the three-dimensional structure of the sample surface by the scanning; and determining the three-dimensional structure of the sample surface from the amount of the secondary electrons measured based on a relation existing between the predetermined three-dimensional structure and the amount of the secondary electrons discharged.

3 Claims, 24 Drawing Figures

SAMPLE SURFACE STRUCTURE MEASURING METHOD

BACKGROUND OF THE INVENTION

This invention relates to a method of measuring minute three-dimensional structure on surfaces of materials with a Scanning Electron Microscope (referred to as "SEM" hereinafter) and more specifically to a method of measuring the depth of holes or grooves on surfaces of semiconductors and the magnitude of side-etching non-destructively with SEM.

Figure 13:
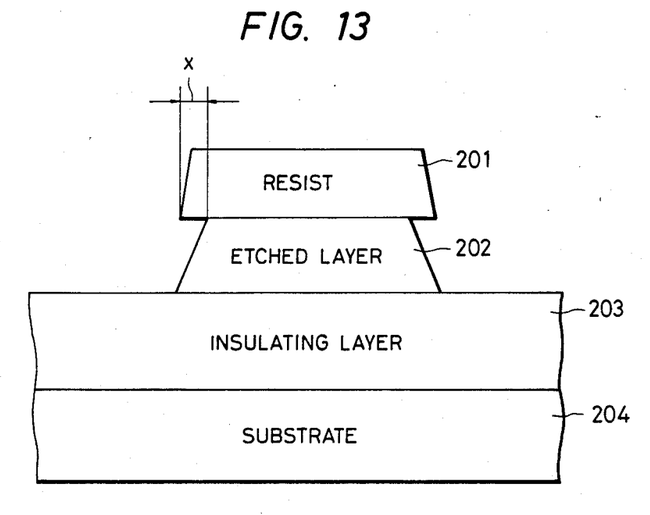
FIG. 13 shows the concept of a VLSI surface after etching.

An example of existing semiconductor surface inspection methods include that by, P. H. Singer which has been described in Semiconductor International Vol. 16, No. 3, pp. 48–54 (1983) under the title of "Linewidth Measurement: Approaching the Submicron Dimension". As shown therein, highly accurate linewidth measurement is possible with SEM. SEM have very large focus depth and by stereo measurement, measurement in the height direction is also possible and has been attracting public attention in relation to the measurement of sectional structures on surfaces of Very Large Scale Integrated Circuits (referred to as "VLSI" hereinafter). In addition to simple stereo methods, methods making use of knowledge on the structure of the area of interest have been also conceived. S. J. Finnes and G. J. Smith have described such a method in IBM Technical Disclosure Bulletin Vol. 26, No. 1 (1983), pp. 189–190, under the title of "Nondestructive Slope/Thickness Measurement for Semiconductor Topology". However, such a method cannot be used when holes or grooves are deep and the bottom area cannot be seen clearly. Also, some sample stands of VLSI length measuring SEM have no inclining function and the above method can not be used in such cases. On the other hand, measurement of the magnitude of side-etching is important to control the structural dimensions in etching. FIG. 13 shows an example of a section near the VLSI surface after etching. In this figure, the etched layer 202 on the substrate 204 and insulating layer 203 is etched according to the resist 201.

In FIG. 13, x indicates the side-etching magnitude. Ideally it is desirable that x is zero, however, even if the sample stand is inclined, the side-etching area is in the shadow and cannot be observed. Therefore, the stereo method cannot be employed. For this reason, in the prior art, when measuring the magnitude of a side-etching, the VLSI was cut and the section was observed with SEM. However, the VLSI was destroyed and the preparation of the cut samples required much time.

SUMMARY OF THE INVENTION

The object of this invention is to provide a method of measuring minute three-dimensional structures on the surface of a material by observation from the above direction with a SEM.

Another object of this invention is to provide a method of measuring the depth of holes or grooves on semiconductor surfaces by observing them from the above direction with a SEM.

A further object of this invention is to provide a method of measuring side-etching magnitudes by obtaining it from SEM signals obtained as the result of observations from the above direction.

The above objects are attained by this invention which provides a surface structure measuring method consisting of applying an electron beam from above to a sample surface, measuring with a SEM the secondary electron amount discharged according to the three-dimensional structure, and deciding the three-dimensional structure of the sample surface from the secondary electron amount measured as described above based on the relation between pre-established three-dimensional structures and the amount of the discharged secondary electrons.

DETAILED DESCRIPTION OF PREFERRED EMBODIMENTS

First, an embodiment to measure the depth of holes and grooves on a semiconductor surface is described.

Figure 1A:
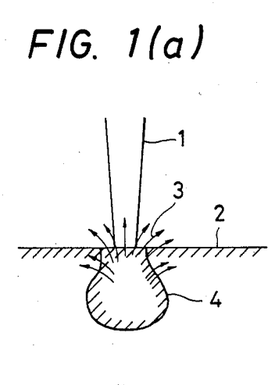
FIGS. 1(a) and (b) indicate the principle of the effect of the inclination of the surface.
Figure 1B:
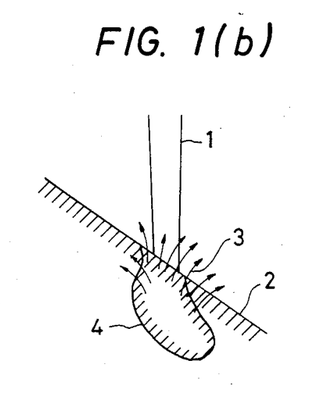
Figure 2:
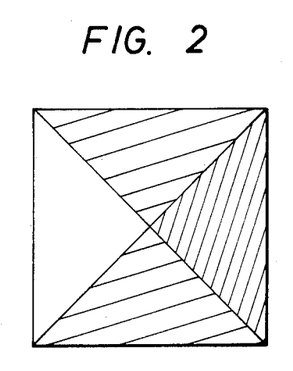
FIG. 2 shows a type of SEM image.
Figure 3A:
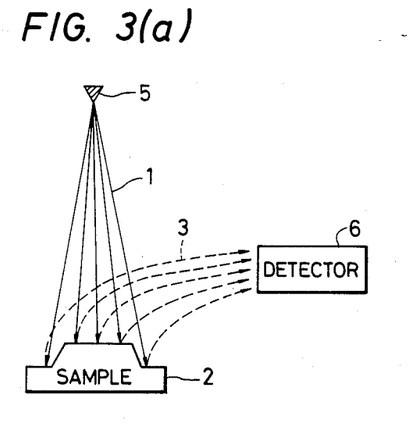
FIGS. 3(a) and (b) describe the shadowless illumination.
Figure 3B:
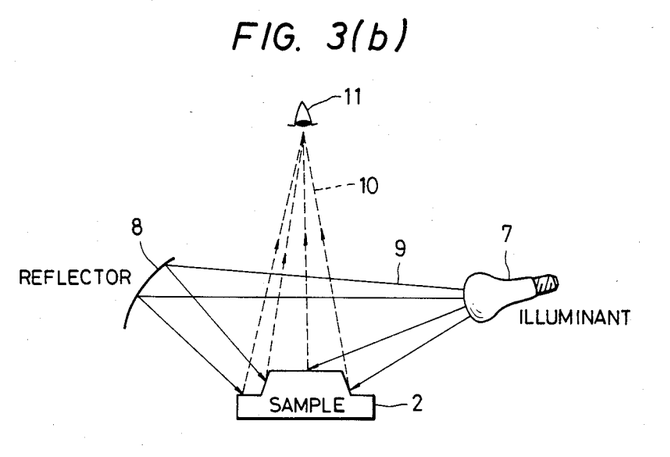

Recently, studies on computer vision have been advancing remarkably and many attempts have been made for recomposition of three-dimensional information from two-dimensional images by monocular vision. Such a situation is described by Katsushi Ikeuchi and B. K. P. Horn in Artificial Intelligence, Vol. 17 (1981), pp. 141–184 under the title of "Numerical Shape from Shading an Occuluding Boundaries". By the "shape from shading analysis" described in this report, three-dimensional information is recomposed from shading images based on the nature of illuminant and surface of the material. Such recomposition is conducted for visible radiation also. Though such recomposition has been made for SEM images, it was only for a very idealized case and detailed considerations were not given to the effect of shadows caused by the minute surface structures and other principle of shapes and images of the SEM. The shape and image principle of SEM is described in "Fundamentals and Applications of Scanning Electron Microscopes", Section 4, compiled by Kanto Branch of Japan Electron Microscope Institute (Kyoritsu Publication). Usually, brightness contrast of SEM images, that is, the difference of the amount of discharged secondary electrons, has been explained in terms of the effect of the inclination of the surface as follows. In FIG. 1, when the incident electron beam 1 enters the sample 2, it is expanded to the diffusion domain 4 within a certain range and secondary electrons are discharged by it. FIG. 1(a) shows a case where the incident electron beam 1 enters the surface of the sample 2 vertically, and FIG. 1(b), at a slant. Since the secondary electron has very low energy, only the ones generated near the surface of the sample leave the surface and reach the detector. The diffusion domain in FIG. 1(b) is nearer to the sample surface than in (a) and therefore more electrons are discharged resulting in higher brightness. This is an explanation of the effect of the inclination of the surface. Generally, however, the sample surface structure and relative position of the detection also have an influence on the detector. FIG. 2 shows a model of image when micro-vickers printing, i.e., indentations in square pyramid shapes, is observed with SEM. In this example, a detector is positioned on the right side in the figure. The angle of the incident electron beam to the 4 sides of the indentation is the same but the brightness is different. A shadowless illumination concept that no shadow is generated as an electric field is applied to the secondary electron 3 and is being discharged when the incident electron beam 1 discharged from the electron gun 5 as shown in FIG. 3 enters the sample 2 and the secondary electron 3 is collected with the detector 6 has been prevailing for SEM so far. When compared with general optical systems, this is equivalent to the fact that, as is shown in FIG. 3(b), when a reflector 8 is placed on the opposite side to the illuminant 7 relative to the sample 2, the sample 2 is illuminated by the incident light 9 from both sides, and the observer 11 looks at the reflected light 10, no shadow is generated. FIG. 2 indicates that the above concept of the shadowless illumination should be changed. For such change, the effect of the shadow in SEM images should be considered when determining at what rate electrons discharged from the surface reach the detector from each place. Especially within the range the surface structure such as minute holes, grooves, etc., the effect of the electric field applied is supposedly not large and the effect of the shadow is important. However, the effect of the shadow reflects the three-dimensional structure such as the depth of holes, shape of opening of holes, etc. By making use of it, three-dimensional information can be obtained. The basic principle of the embodiment makes use of the effect of a shadow which has been used little so far. When holes, grooves, etc. are observed from above with SEM, the brightness and variation of the brightness of the holes, grooves, etc. vary depending on the depth. By determining the relation between the brightness and its variation and depth beforehand, the depth can be obtained. To obtain such relation, a method to collect data on the depth measured by cutting samples and the brightness distribution obtained by observing the samples from above and a method to calculate theoretically are available.

Figure 4:
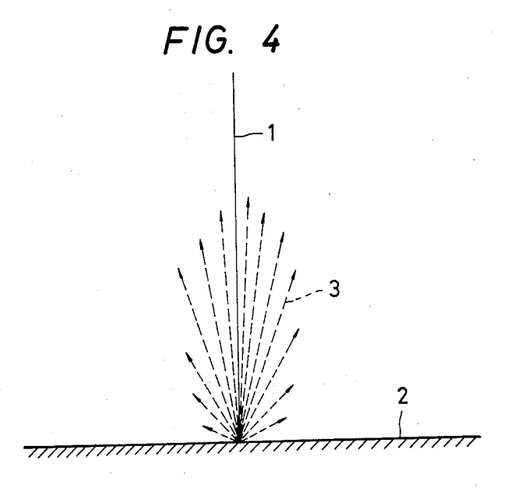
FIGS. 4 and 5 are sectional views of samples discharging the secondary electron.
Figure 5:
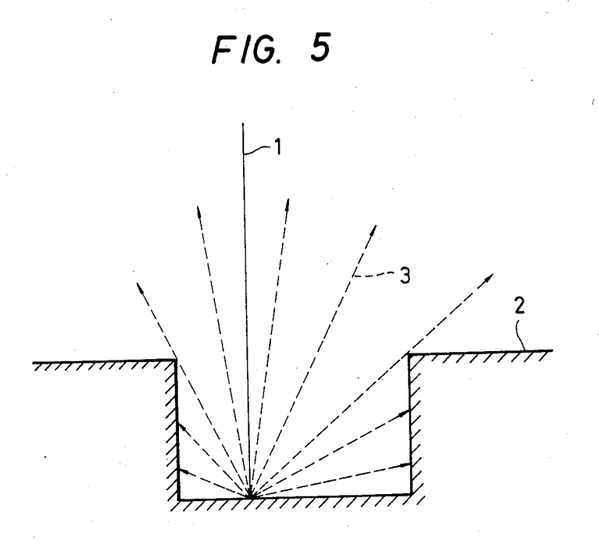
Figure 6:
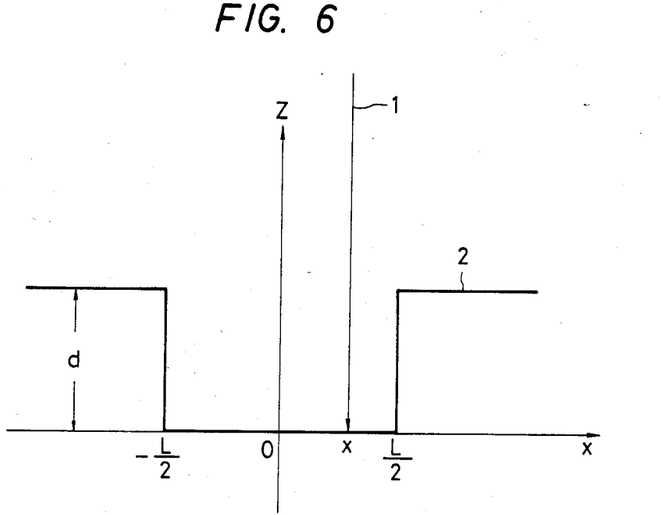
FIGS. 6, 7, 8, and 9 show the relation between groove, square hole, wall and hole of any contour and a coordinate system respectively, FIGS. 10(a) and (b) are a sample sectional view and related SEM signal waveform.

Theoretically, for instance, it can be calculated on the assumption as follows. (1) Secondary electrons are discharged at the angle distribution according to Lambert's cosine law. (2) Electrons advance straight in holes, grooves, etc. (3) Electrons which run against the wall are all absorbed by the wall. (4) All the electrons which go out of the holes, grooves, etc. are absorbed by the detector. (5) The contribution of reflected electrons is small and disregarded. Such assumptions are described in detail below. In FIG. 4, the secondary electrons 3 are induced by the incident electron beam 1 and discharged approximately in proportion to $\cos \theta$ when the angle of the incident electron to the normal line of the sample surface 2 is assumed to be $\theta$. In FIG. 5, some of the discharged secondary electrons 3 advance straight, others run against the surface of the sample 2 before going out of the hole and are absorbed by it, or others go out of the hole. The rate of the absorption varies depending on the points of incident. The area near the wall is dark and the center is relatively bright. FIG. 6 is a sectional view of a groove. Taking the horizontal direction as the abscissa and the vertical direction as the ordinate, the groove width of the sample 2 is L and the depth is d. When the electron beam 1 enters at the position x, the rate of electrons which go out of the groove, $f_g(x)$, is expressed by the following equations.

$$f_g(x) = \frac{1}{2}\left( \frac{\frac{L}{2} - x}{\sqrt{\left(\frac{L}{2} - x\right)^2 + d^2}} + \frac{\frac{L}{2} + x}{\sqrt{\left(\frac{L}{2} + x\right)^2 + d^2}} \right)$$

$$\left(-\frac{L}{2} < x < \frac{L}{2}\right)$$

$$= 1 \left(|x| \geq \frac{L}{2}\right)$$

Figure 7:
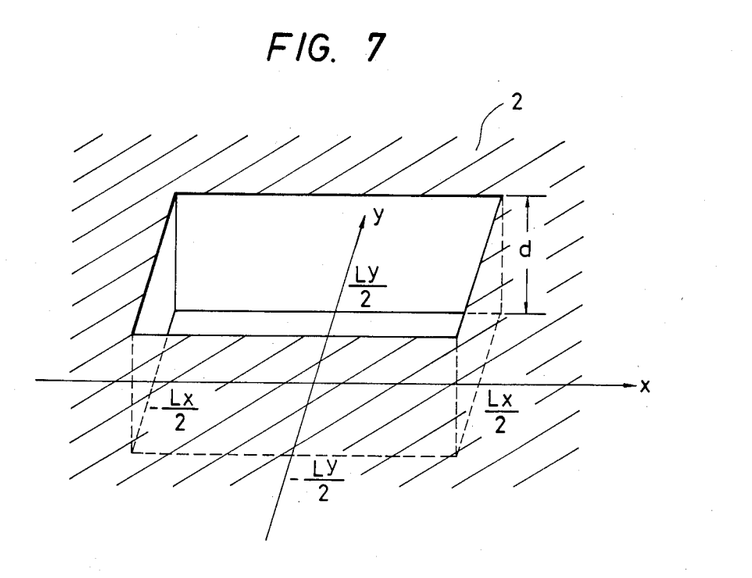
Figure 8:
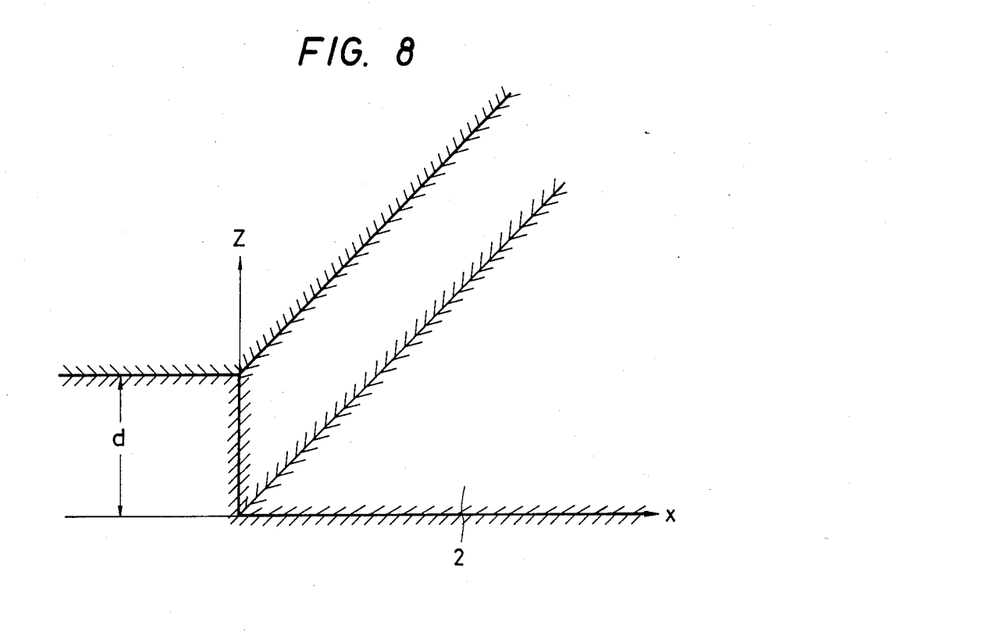

FIG. 7 is a bird's-eye view of a hole with an opening of a rectangle with the side length of Lx and Ly, respectively, and the depth d and the coordinate system for it, and FIG. 8 is a bird's-eye view of a wall with a level difference of d and the coordinate system for it. When calculated in the same way, the rate of electrons discharged which reach the detector, $f_h(x,y)$ and $f_\omega(x)$, respectively, for FIG. 7 and FIG. 8, is described as follows.

$$f_h(x, y) = \frac{d^2}{\pi}\left[ J\left(\frac{L_x}{2} - x_0, \frac{L_y}{2} - y_0\right) + J\left(\frac{L_x}{2} + x_0, \frac{L_y}{2} - y_0\right) + J\left(\frac{L_x}{2} - x_0, \frac{L_y}{2} + y_0\right) + J\left(\frac{L_x}{2} + x_0, \frac{L_y}{2} + y_0\right) \right]$$

(In the hole)

= 1 (Out of the hole)

where, $$J(p,q) = \frac{1}{2d^2}\left( \frac{q}{\sqrt{q^2 + d^2}} \arctan \frac{p}{\sqrt{q^2 + d^2}} + \frac{p}{\sqrt{p^2 + d^2}} \arctan \frac{q}{\sqrt{p^2 + d^2}} \right)$$

$$f_\omega(x) = \frac{1}{2}\left( 1 + \frac{x}{\sqrt{x^2 + d^2}} \right) \quad (x > 0)$$

$$= 1 \quad (x < 0)$$

Figure 9:
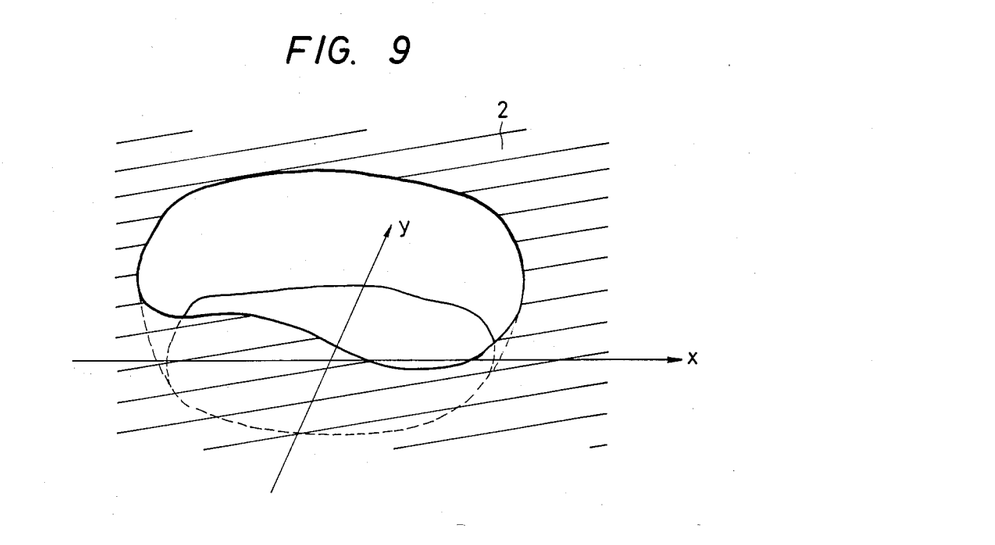

FIG. 9 is a bird's-eye view of a hole with any opening contour and a coordinate system for it. As in the cases in FIGS. 7 and 8, the rate of electrons discharged which reach the detector, f(x,y), is obtained by evaluating the integral calculus as follows for the opening.

$$f(x,y) = \frac{1}{\pi} \int \int \frac{d^2}{\{(p-x)^2 + (q-y)^2 + d^2\}^2} dpdq$$
(In the hole)

$$= 1 \text{ (Out of the hole)}$$

Those holes of contours other than the above ones can be calculated based on the above assumptions.

Figure 10A:
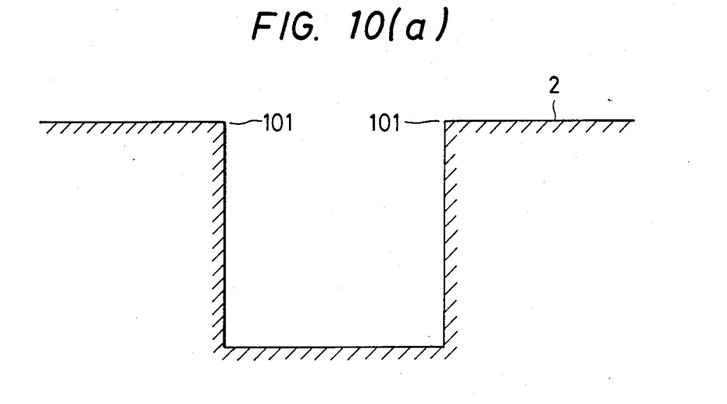
Figure 10B:
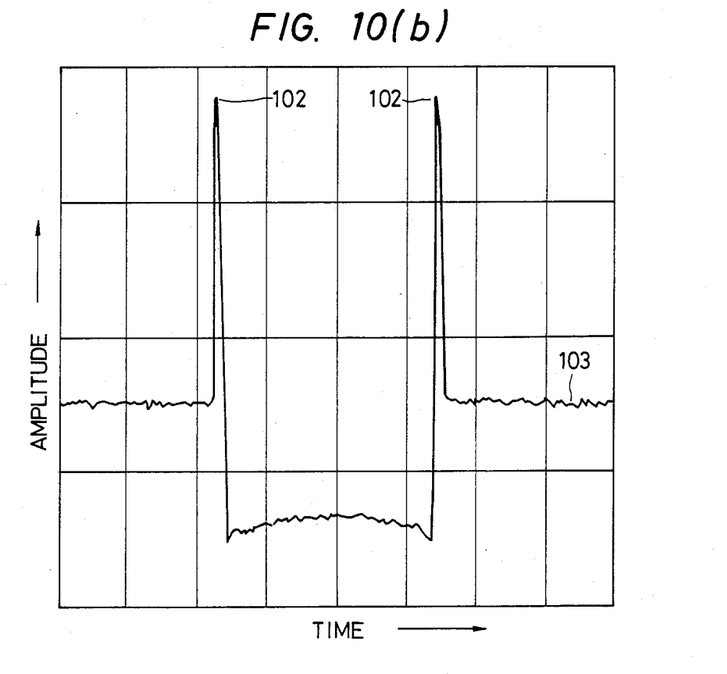

Examples of theoretical calculation of the relation between the surface structure and brightness in SEM were described above. An example of the brightness for grooves is shown in FIG. 10. FIG. 10(a) is a sectional view of the groove which was explained referring to FIG. 6 and FIG. 10(b) is an equivalent line profile of the SEM corresponding to it. At the corners of the groove 101, conspicuous peak 102 is observed, which is not described here. At the bottom of the groove, it is bright at the center and dark at corners.

Brightness at various points of the samples were calculated above giving sample surface structures. Using these relations adversely, the depth of grooves, holes, etc. can be obtained. For instance, in FIG. 10, assuming the brightness of the line profile of SEM 103 on the outside of the groove as $f_A$ and the brightness at the center of the groove as $f_B$, the following equation can be obtained from the above-described equation for $f_g$.

$$f_B = \frac{Lf_A}{\sqrt{L^2 + 4d^2}}$$

From this, an equation describing the depth d using $f_A$, $f_B$, and groove width L which can be easily obtained by the observation from above can be obtained.

$$d = \frac{L}{2} \sqrt{\left(\frac{f_A}{f_B}\right)^2 - 1}$$

For minute measurements, the depth can be obtained by measuring the curvature of the line profile at the center of the groove and obtaining its relation to the depth. It is also possible to know the depth by obtaining the relation between the brightness on the outside and the one at the center of the groove, for example, beforehand instead of connecting the depth and brightness by the theoretical consideration as described above.

Figure 11:
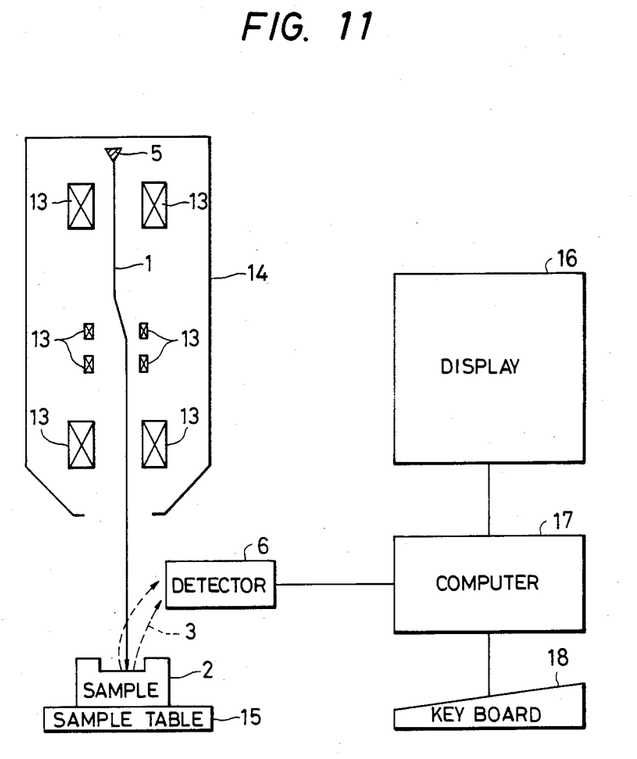
FIG. 11 is a block diagram of hardware of an embodiment of this invention.
Figure 12:
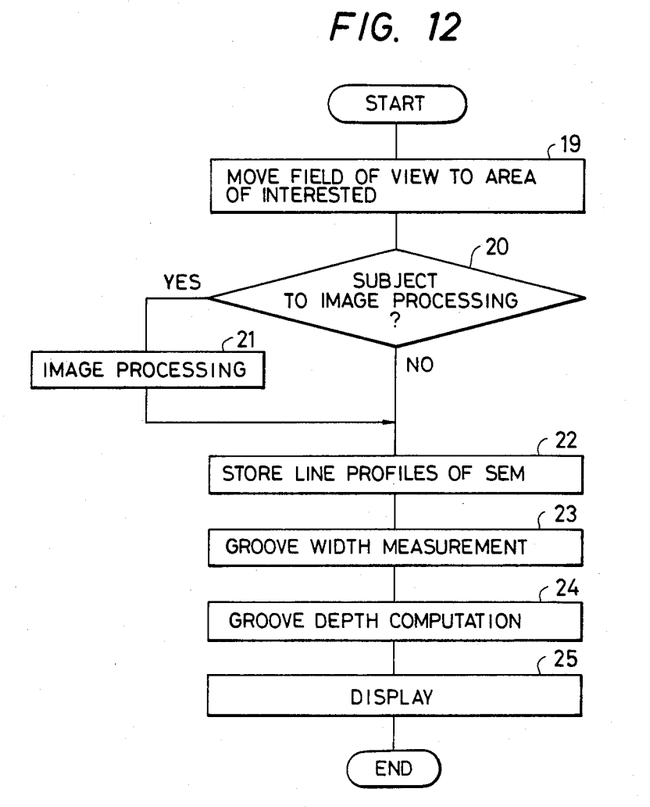
FIG. 12 is a flow chart for depth measurement by this embodiment.

FIG. 11 is a block diagram of a hardware composition for this embodiment. In this figure, the electron beam 1 discharged from the electron gun 5 in the SEM system 14 is converged and deflected by the electron lens system 13 and scans the surface of the sample 2 on the sample table 15. Accordingly, the secondary electrons 3 are discharged and detected by the detector 6. The detected signal is indicated on the display 16 as it is or after undergoing a proper noise removal treatment by the computer 17. The computer 17 processes the signal sent from the detector 6 and, according to the instructions of the key board 18, produces information on depth and indicates it on the display 16. FIG. 12 is a flowchart to show the processing procedure of this embodiment, though it is limited to the groove depth. In this figure, the operator moves the field of view to the area interested first at the step 19. At the step 20, the image is processed and then it is selected whether the depth is measured or not. At the step 22, the line profile at the area of interest is memorized and at the step 23, the groove width is measured from the memorized line profile. From this line profile and groove width value, the depth is calculated at the step 24 and the result is displayed at the step 25. As described above, according to this embodiment, depth measurement free from noise is possible by the image processing for improving picture quality.

According to this embodiment, the depth of holes, grooves, etc. can be obtained by observing them from above and therefore the depth measurement is possible even if the sample table has no rotating function. Also, this method has such an advantage that deep holes and grooves for which measurement was impossible before can be measured.

Next, an embodiment for measuring the magnitude of side-etching in semiconductor equipment is described.

Figure 14A:
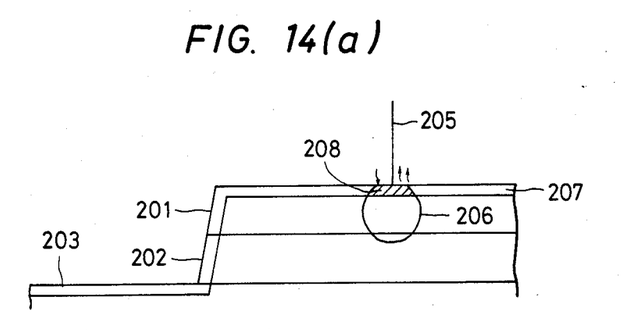
FIGS. 14(a), (b), and (c) describe the discharged secondary electron.
Figure 14B:
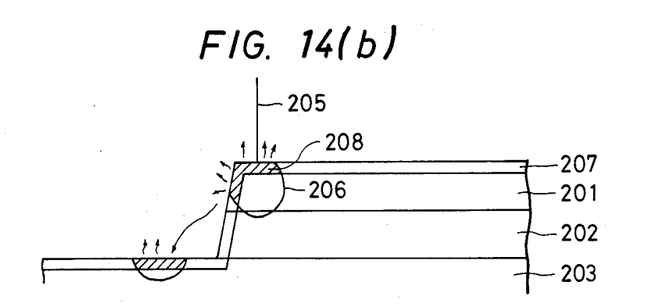
Figure 14C:
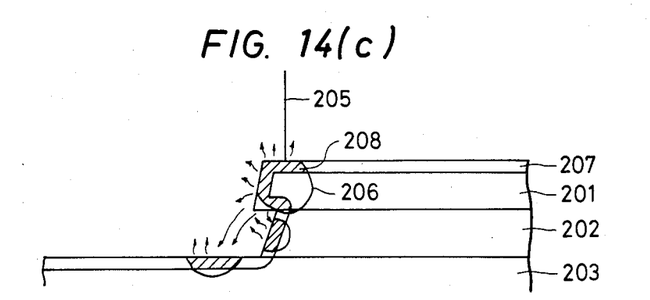
Figure 15A:
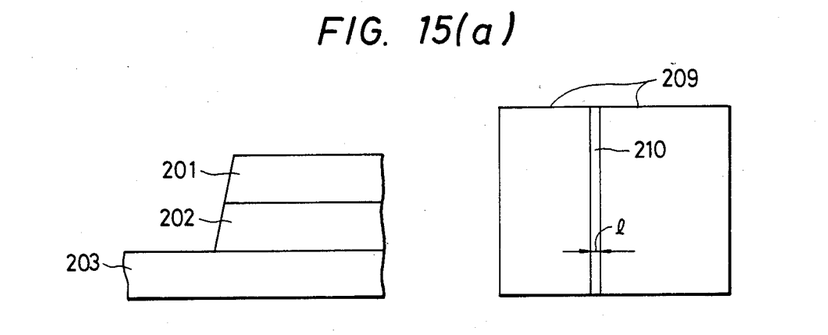
FIGS. 15(a), (b) and (c) show the concept of magnitude of side etching on VLSI surface and corresponding SEM image.
Figure 15B:
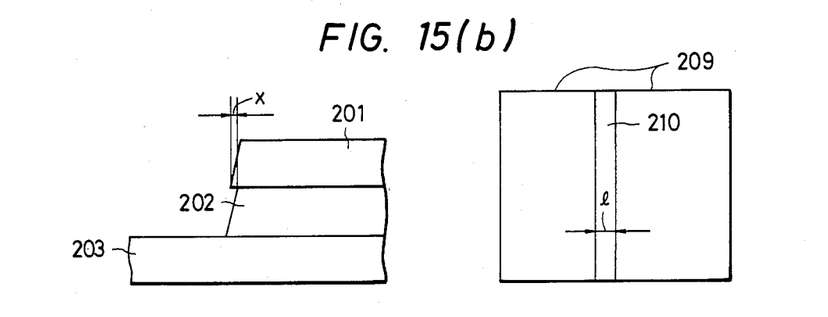
Figure 15C:
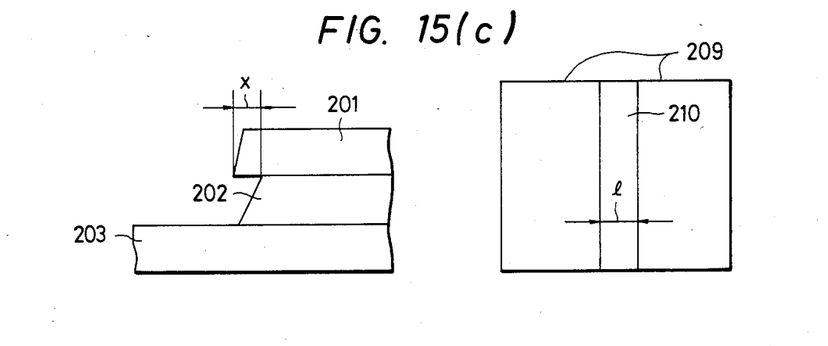
Figure 16:
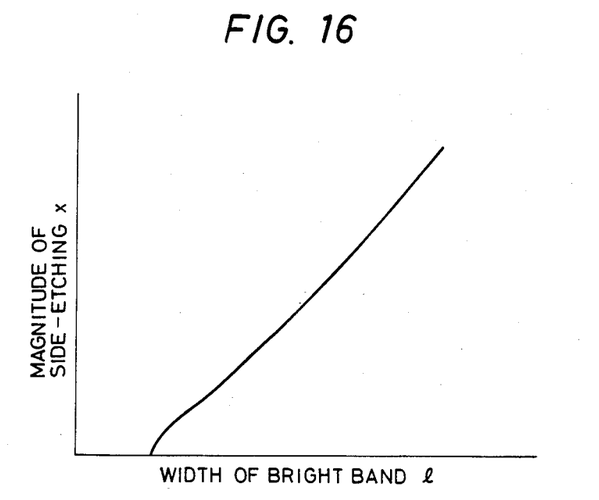
FIG. 16 shows an example of a graph for the relation between the width of the bright band and side-etching magnitude.

FIG. 14 shows a type of generation of the secondary electron in a SEM. In FIG. 14(a), the incident electron 205 generates the secondary electron while repeating dispersion in the solid sample and expanding to the diffusion domain 206 after incidence. The secondary electron has an energy less than 50 eV usually and therefore only those generated in the layer 207 up to several tens of A below the sample surface can go out of the sample surface. Residual electrons are absorbed in the sample. From this, the discharged secondary electrons are those generated at the common area 208 of the diffusion domain 206 and layer 207. The sizes of the secondary electron signals in SEM can be described qualitatively by such a concept. Especially in cases such as in FIG. 14(b), the secondary electrons are generated not only on the top surface of the sample, but also from the layer near the side. Also the secondary electrons are generated from the surface below the level difference by the incident electrons after passing through the sample and going out of the side surface. When the electrons enter near the edge, many secondary electrons are generated and the area near the edge looks bright in the SEM image. This effect is known as an edge effect. The basic principle of this embodiment was obtained by applying the above concept to the VLSI surface after the side-etching. In FIG. 14(c), the common area 208 of the diffusion domain 206 and layer 207 of the incident electron 205 becomes larger with the side-etching surface added also in addition to the edge in FIG. 14(b). Furthermore, it is anticipated that the secondary electrons discharged by the electrons being transmitted through the resist 201 and entering the slope of the etched layer 202 such as polysilicone, etc., and the secondary electrons discharged by the electrons entering the insulating layer 203 in the lower part such as $SiO_2$, etc. are added, so that it looks brighter in the case of FIG. 14(c) than in the case of FIG. 14(b). FIGS. 15(a)-(c) show the SEM images when the side-etching magnitude varies. The concept of the relation between the width l of the bright band 210 and x in FIG. 15 is shown in FIG. 16. This relation depends on the materials of samples, accelerating voltage of electrons, etc. and can be obtained theoretically also. However, the side-etching magnitude can be presumed only from the observation from above by actually cutting a sample and obtaining the relation between the side-etching magnitude and width of the bright band, or the SEM signals corresponding to 1 scanning experimentally.

Figure 17:
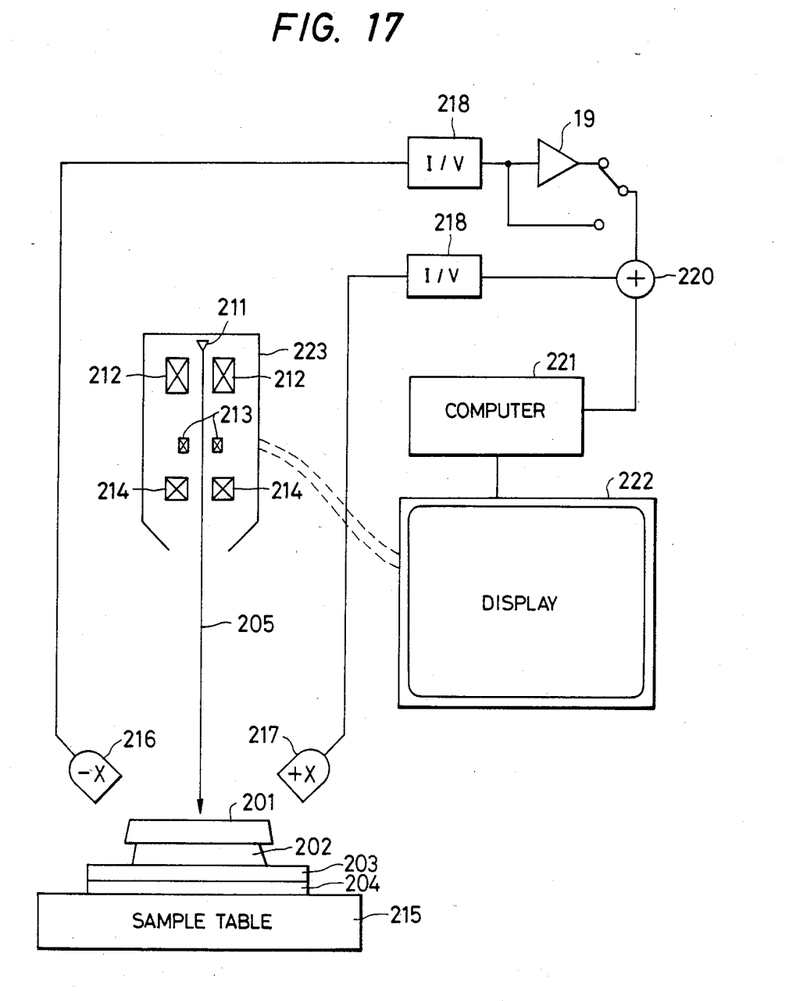
FIG. 17 is a block diagram of another embodiment of this invention.

FIG. 17 shows an example of the hardware composition for side-etching amount measurement. A VLSI to be measured is placed on the sample table 215 and observed by the electron beam 205 discharged from the body tube 223 of SEM. The secondary electron generated by the incidence of electron beam 205 formed with the electron gun 211, converging lens 212, scanning coil 213, and object lens 214 has a directional property when discharged and is therefore measured with the sensors 216 and 217 from 2 directions. These signals are converted to a voltage with the current-voltage converter 218 and detected as a total signal and difference signal with the inverter 219 and adder 220 when necessary. The scanning coil 213 is synchronized with the brightness modulation signals on the display 222, thus producing SEM images. For the measurement, an operator measures on display 222 the width l of the bright band 210 in FIG. 15 considering the magnification and other observation conditions. The side-etching magnitude is presumed from this value of the width of the bright band using the relation between the width of the bright band and side-etching magnitude which was determined beforehand using a cut sample. For automatic measurement by this method, the side-etching magnitude is presumed by storing SEM scanning signals of 1 line which was obtained by measuring a cut sample in the computer 221 shown in FIG. 17 and matching them as a template with measured signals. As described above, the side-etching magnitude can be presumed non-destructively and at high speed according to this embodiment.

This method can use a normal SEM economically.

What is claimed is:

1. A side-etching amount measuring method for a scanning type electron microscope comprising the step of measuring a side-etching amount from a width of a bright band observed when an electron beam is applied from above a resist, using a relation between a side-etching amount actually measured for a cut sample beforehand and the width of the bright band.

2. A sample surface groove depth measuring method using a SEM comprising the steps of:
    measuring the brightness $f_A$ on the outside of a groove and the brightness $f_B$ at the center of the groove in an image of a SEM;
    measuring the width L of the groove on the basis of the image of the SEM;
    obtaining the depth d of the groove from an equation;

$$d = \frac{L}{2} \sqrt{\left(\frac{f_A}{f_B}\right)^2 - 1}.$$

3. A side-etching amount measuring method using a SEM comprising the steps of:
    measuring the width l of a bright band observed in an image of a SEM when an electron beam is applied from above a resist on a sample to be measured;
    obtaining an amount x of side-etching in the sample from an equation $x = al + b$, where a and b are constants determined by the relation between the amounts x of side-etching and the widths l of the bright bands actually measured with cut samples beforehand.

* * * * *